US006487106B1

(12) United States Patent
Kozicki

(10) Patent No.: US 6,487,106 B1
(45) Date of Patent: Nov. 26, 2002

(54) PROGRAMMABLE MICROELECTRONIC DEVICES AND METHOD OF FORMING AND PROGRAMMING SAME

(75) Inventor: Michael N. Kozicki, Phoenix, AZ (US)

(73) Assignee: Arizona Board of Regents, Phoenix, AZ (US)

( * ) Notice: Subject to any disclaimer, the term of this patent is extended or adjusted under 35 U.S.C. 154(b) by 0 days.

(21) Appl. No.: 09/502,915

(22) Filed: Feb. 11, 2000

Related U.S. Application Data

(63) Continuation-in-part of application No. 09/228,727, filed on Jan. 12, 1999, now Pat. No. 6,084,796.
(60) Provisional application No. 60/119,757, filed on Feb. 11, 1999.

(51) Int. Cl.[7] .............................................. G11C 11/00
(52) U.S. Cl. ................ 365/153; 257/3; 257/4
(58) Field of Search ................ 365/107, 153; 257/4, 3

(56) References Cited

U.S. PATENT DOCUMENTS

| 3,271,591 A | 9/1966 | Ovshinsky |
| 3,530,441 A | 9/1970 | Ovshinsky |
| 3,715,634 A | 2/1973 | Ovskinsky |
| 3,765,956 A | 10/1973 | Li |
| 3,846,767 A | 11/1974 | Cohen |
| 3,875,566 A | 4/1975 | Helbers |
| 3,886,577 A | 5/1975 | Buckley |
| 3,980,505 A | 9/1976 | Buckley |
| 3,988,720 A | 10/1976 | Ovskinsky |
| 4,199,692 A | 4/1980 | Neale |
| 5,177,567 A | 1/1993 | Klersy et al. |
| 5,288,381 A * | 2/1994 | Cogan et al. .......... 204/192.26 |
| 5,296,835 A | 3/1994 | Nakamura |
| 5,315,131 A | 5/1994 | Kishimoto et al. |
| 5,500,532 A | 3/1996 | Kozicki |
| 5,512,773 A | 4/1996 | Wolf et al. |
| 5,541,869 A | 7/1996 | Rose et al. .................. 365/100 |
| 5,596,500 A | 1/1997 | Sprague et al. |
| 5,646,629 A | 7/1997 | Loomis et al. |
| 5,761,115 A | 6/1998 | Kozicki et al. |
| 5,912,839 A | 6/1999 | Ovshinsky et al. |
| 5,914,893 A | 6/1999 | Kozicki et al. |
| 5,933,365 A | 8/1999 | Klersy et al. |

OTHER PUBLICATIONS

Electrical switching in AgI based fast ion conducting glasses: Possibility for newer application; B. Vaidhyanathan and K.J. Rao, S. Prakash, S. Murugavel, and S. Asokan; J. Appl. Phys 75 (2), Jul. 15, 1995; American Institute of Physics; pp. 1358–1360.

Ion Transport in Solids Under Conditions Which Include Large Electric Fields; M.J. Dignam; Pergamon Press 1968 vol. 29, pp. 249–260.

Electric field enhanced phase separation and memory switching in amorphous electric triselenide; David D. Thornburg and Robert M. White; J. Appl. Phys., vol. 43, No. 11, Nov. 1972.

Nucleation in Solid Solution Stimulated by Non–Equilibrium Electrons; I. Electronic Model; S. Stoyanov, D. Kashchiev, and M. Georgiev; phys. stat.sol. 41, pp. 387–394 1970.

Nucleation in Solid Stimulated by Non–Equilibrium Electrons; II. Electronic Model; S. Stoyanov, D. Kashchiev, and M. Georgiev; phys. stat.sol. 41, pp. 395–404 1970.

(List continued on next page.)

*Primary Examiner*—Son T. Dinh
(74) *Attorney, Agent, or Firm*—Snell & Wilmer L.L.P.

(57) ABSTRACT

A microelectronic programmable structure and methods of forming and programming the structure are disclosed. The programmable structure generally include an ion conductor and a plurality of electrodes. Electrical properties of the structure may be altered by applying a bias across the electrodes, and thus information may be stored using the structure.

20 Claims, 6 Drawing Sheets

OTHER PUBLICATIONS

Nucleation in External Electric Field; D. Kashchiev; Journal of Crystal Growth 13/14 (1972) pp. 128–130.

Percolation transition Ag–doped germanium chalcogenide–based glasses: conductivity and silver diffusion results; E. Bychkov, V. Tsegelnik, Yu. Vlasov, A. Pradel, M. Ribes; Journal of Non–Crystalline Solids 208 (1996) pp. 1–20.

Polarized Memory Switching in MIS Thin Films; L.C. Bernede; Thin Solid Films, 81 (1981) pp. 155–160.

Polarized Memory Switching Effects in Ag2Se/Se/M Thin Film Sandwiches; Thin Solid Films, 97 (1982) pp. 165–171. Letter; Thin Solid Films, 70 (1980) pp. L1–L4.

Short Communication; Electrical Characterization of M/Se Structures (M=Ni, Bi) Materials Chemistry and Physics, 28 (1991) 253–258.

2D and 3D Thin Film Formation and Growth Mechanisms in Metal Electrocrystallization—an Atomistic View by in Situ STM; W.J. Lorenz and G. Staikov; Surface Science 335; pp. 32–43; (1995).

Growth Rate Fractal Copper Electrodeposits: Potential and Concentration Effects; J.M. Costa, F. Safues, and M. Vilarrasa; Physical Review A; vol. 43, No. 12 (1991).

Electrochemically Controlled Growth and Dissolution of Silver Whiskers; J. Corish, C.D. O'Briain; Journal of Materials Science; 6 (1971) 252–259.

Metal Photosurface Deposition in As–S–Ag Glasses; Shigeo Maruno and Takeshi Kawaguchi;Journal of Applied Physics, vol. 46, No. 12, Dec. 1975; 5312–5314.

Photo–induced Structural and Physico–Chemical Changes in Amorphous Chalcogenide Semiconductors; A.E. Owen, A.P. Firth and P.J.S. Ewen; Philoosophical Magazine B. vol. 52, No. 3 (1985); pp. 347–362.

Electronic Memory Switching in a New Charge Transfer–Complex Thin Film; K.Z. Wang, Z.Q. Xue, M. Ouyang, H.XX. Zhang; Solid State Communications, vol. 96, No. 7, pp. 481–484, 1995.

Diffusion–limited Aggregation; T.A. Witten; Exxon Research and Engineering Company, Linden, New Jersey 07036; Physical Review B; vol. 27, No. 9, May 1, 1983.

Pattern Selection in Dendriteic Solidification; E. Ben Jacob, Nigel Goldenfeld, B.G. Kotliar and J.S. Langer; Physical-Review Let RS; vol. 53, No. 2; Nov. 25, 1984.

Electrochemical Aspects of the Generation of Ramified Metallic Electrodeposits; J.N. Chazalviel; Physical Review A; vol. 42, No. 12; Dec. 15, 1990.

Electrochemical Growth of Single Metal and Alloy Clusters—Part 1. Galvanostatic Conditions; Dectrochimice Acid, vol. 38, No. 4, pp. 535–539; 1993.

High Speed Memory Behavior and Reliability of an Amorphous As2S3 Film Doped with Ag; Y. Hirose, H. Hirose and M. Morisue; Department of Electrical Engineering, Nippon Institute of Techology, Saitama;pp. K187–K190; 1980.

A Study on the Nanvolatile Memory Effect of Amorphous As2S3 Film Utilizing Photodoping Method; Hong–Bay Chung, Young–Ho Kim, and Byong–Kyu Shin; Journal of the Electric Society (Korea), vol. 34, #6, pp. 238–243, Jun. 1985.

Mechanism of Photosurface Deposition; T. Kawaguchi, S. Maruno, and K. Tanaka, Journal of Non–Crystalline Solids 164–166 (1993).

Equivalent Circuit Modeling of the Ag/Aso.24So.36Ag0.40/Ag System Prepared by Photodissolution of Ag; Appearing in the Journal of the Electrochemical Society; vol. 145, N. 9, Sep. 1998.

The Programmable Metallization Cell—Potential Applications in Crtical Electronic Systems; Appearing in the Proceedings of the 1998 International Conference on Integrated Nano/Microtechnology for Space Applications; Paper Presented at the Nasa/Saic Sponsored Nanospace 98 Conference, Houston, Texas, Nov. 1–6, 1998.

Applications of Programmable Resistance Changes in Metal–Doped Chalcogenides; To Appear in the Proceedings of the 1999 Symposium on Solid State Ionic Devices; Editors—E.D. Wachsman et al. The Electrochemical Society, Inc.; ISMBN 1–566–77–235–4; Paper Presented at the 195th Meeting of the Electrochemical Society, Seattle, Washington, May 2–7, 1999.

Nanoscale Effects in Devices Based on Chalcogenide Solid Solutions; To Appear in the Proceedings of the 1999 Meeting on Surfaces and Interfaces of Mesoscopic Devices; in Superlattices and Microstructures, Academic Press; Paper presented at Surfaces and Interfaces of Mesocopic Devices, Maui, Hawaii, Dec. 5–10, 1999.

Programmable Current Mode Hebbian Learning Neural Network Using Programmable Metallization Cell; B. Swaroop, W.C. West, G. Martinez, M.N. Kozicki, and L.A. Akerst; Center for Solid State Electronics Research; Arizona State University; Temple, Arizona; Division of Engineering; University of Texas at San Antonio, Texas; as presented at ISCAS '98; The International Symposium on Circuits and Systems; May 31–Jun. 3, 1998; Hosted by the Naval Postgraduate School.

The Photo–Erasable Memory Switching Effect of Ag Photo–Doped Chalcogenide Glasses; Isamu Shimizu, Hiroshi Kokado, and Eiichi Inoue; Bulletin of the Chemical Society of Japan, vol. 46No. 12; pp. 3662–3665 (1973).

Polarity–dependent Memory Switching and Behavior of Ag Dendrite in Ag–Photodoped Amorphous As2S3 Films; Yooichi Hirose and Haruo Hirose; Department of Electrical Engineering, Nippon Institute of Technology, Miyashiro, Minami–Saitama Saitama 345, Japan; pp. 2767–2772.

* cited by examiner

PROGRAMMABLE MICROELECTRONIC DEVICES AND METHOD OF FORMING AND PROGRAMMING SAME

CROSS REFERENCE TO RELATED APPLICATIONS

This application claims the benefit of U.S. Provisional Application Ser. No. 60/119,757, filed Feb. 11, 1999 and International Application Ser. No. PCT/US98/25830, filed Dec. 4, 1998 and is a continuation-in-part of U.S. application Ser. No. 09/228,727, filed Jan. 12, 1999 now U.S. Pat. No. 6,084,796.

FIELD OF THE INVENTION

The present invention generally relates to microelectronic devices. More particularly, the invention relates to programmable microelectronic structures suitable for use in integrated circuits.

BACKGROUND OF THE INVENTION

Memory devices are often used in electronic systems and computers to store information in the form of binary data. These memory devices may be characterized into various types, each type having associated with it various advantages and disadvantages.

For example, random access memory ("RAM") which may be found in personal computers is volatile semiconductor memory; in other words, the stored data is lost if the power source is disconnected or removed. Dynamic RAM ("DRAM") is particularly volatile in that it must be "refreshed" (i.e., recharged) every few microseconds in order to maintain the stored data. Static RAM ("SRAM") will hold the data after one writing so long as the power source is maintained; once the power source is disconnected, however, the data is lost. Thus, in these volatile memory configurations, information is only retained so long as the power to the system is not turned off In general, these RAM devices may be expensive to manufacture and consume relatively large amounts of energy during operation of the devices. Accordingly, improved memory devices suitable for use in personal computers and the like are desirable.

CD-ROM and DVD-ROM are examples of non-volatile memory. DVD-ROM is large enough to contain lengthy audio and video information segments; however, information can only be read from and not written to this memory. Thus, once a DVD-ROM is programmed during manufacture, it cannot be reprogrammed with new information.

Other storage devices such as magnetic storage devices (e.g., floppy disks, hard disks and magnetic tape) as well as other systems, such as optical disks, are non-volatile, have extremely high capacity, and can be rewritten many times. Unfortunately, these memory devices are physically large, are shock/vibration-sensitive, require expensive mechanical drives, and may consume relatively large amounts of power. These negative aspects make these memory devices non-ideal for low power portable applications such as lap-top and palm-top computers, personal digital assistants ("PDAs"), and the like.

Due, at least in part, to a rapidly growing numbers of compact, low-power portable computer systems in which stored information changes regularly, read/write semiconductor memories have become increasingly desirable and widespread. Furthermore, because these portable systems often require data storage when the power is turned off, non-volatile storage device are desired for use in such systems.

One type of programmable semiconductor non-volatile memory device suitable for use in such systems is a programmable read-only memory ("PROM") device. One type of PROM, a write-once read-many ("WORM") device, uses an array of fusible links. Once programmed, the WORM device cannot be reprogrammed.

Other forms of PROM devices include erasable PROM ("EPROM") and electrically erasable PROM (EEPROM) devices, which are alterable after an initial programming. EPROM devices generally require an erase step involving exposure to ultra violet light prior to programming the device. Thus, such devices are generally not well suited for use in portable electronic devices. EEPROM devices are generally easier to program, but suffer from other deficiencies. In particular, EEPROM devices are relatively complex, are relatively difficult to manufacture, and are relatively large. Furthermore, a circuit including EEPROM devices must withstand the high voltages necessary to program the device. Consequently, EEPROM cost per bit of memory capacity is extremely high compared with other means of data storage. Another disadvantage of EEPROM devices is that although they can retain data without having the power source connected, they require relatively large amounts of power to program. This power drain can be considerable in a compact portable system powered by a battery.

In view of the various problems associated with conventional data storage devices described above, a relatively non-volatile, programmable device which is relatively simple and inexpensive to produce is desired. Furthermore, this memory technology should meet the requirements of the new generation of portable computer devices by operating at a relatively low voltage while providing high storage density, and a low manufacturing cost.

SUMMARY OF THE INVENTION

The present invention provides improved microelectronic devices for use in integrated circuits. More particularly, the invention provides relatively non-volatile, programmable devices suitable for memory and other integrated circuits.

The ways in which the present invention addresses various drawbacks of now-known programmable devices are discussed in greater detail below. However, in general, the present invention provides a programmable device that is relatively easy and inexpensive to manufacture, and which is relatively easy to program.

In accordance with one exemplary embodiment of the present invention, a programmable structure includes an ion conductor and at least two electrodes. The structure is configured such that when a bias is applied across two electrodes, one or more electrical properties of the structure change. In accordance with one aspect of this embodiment, a resistance across the structure changes when a bias is applied across the electrodes. In accordance with other aspects of this embodiment, a capacitance, or other electrical properties of the structure change upon application of a bias across the electrodes. One or more of these electrical changes may suitably be detected. Thus, stored information may be retrieved from a circuit including the structure.

In accordance with another exemplary embodiment of the invention, a programmable structure includes an ion conductor, at least two electrodes, and a barrier interposed between at least a portion of one of the electrodes and the ion conductor. In accordance with one aspect of this embodiment the barrier material includes a material configured to reduce diffusion of ions between the ion conductor and at least one electrode. The diffusion barrier may also serve to prevent undesired electrodeposit growth within a portion of the structure. In accordance with another aspect, the barrier material includes an insulating material. Inclusion of an insulating material increases the voltage required to reduce the resistance of the device to its lowest possible value. Devices including an insulating barrier may be well suited for non-volatile memory (e.g., EEPROM) applications.

In accordance with another exemplary embodiment of the invention, a programmable microelectronic structure is formed on a surface of a substrate by forming a first electrode on the substrate, depositing a layer of ion conductor material over the first electrode, and depositing conductive material onto the ion conductor material. In accordance with one aspect of this embodiment, a solid solution including the ion conductor and excess conductive material is formed by dissolving (e.g., via thermal or photodissolution) a portion of the conductive material in the ion conductor. In accordance with a further aspect, only a portion of the conductive material is dissolved, such that a portion of the conductive material remains on a surface of the ion conductor to form an electrode on a surface of the ion conductor material.

In accordance with another embodiment of the present invention, at least a portion of a programmable structure is formed within a through-hole or via in an insulating material. In accordance with one aspect of this embodiment, a first electrode feature is formed on a surface of a substrate, insulating material is deposited onto a surface of the electrode feature, a via is formed within the insulating material, and a portion of the programmable structure is formed within the via. In accordance with one aspect of this embodiment, after the via is formed within the insulating material, a portion of the structure within the via is formed by depositing an ion conductive material onto the conductive material, depositing a second electrode material onto the ion conductive material, and, if desired, removing any excess electrode, ion conductor, and/or insulating material.

In accordance with a further exemplary embodiment of the invention, multiple bits of information are stored in a single programmable structure.

In accordance with yet another exemplary embodiment of the present invention, a capacitance of a programmable structure is altered by causing ions within an ion conductor of the structure to migrate.

BRIEF DESCRIPTION OF THE DRAWINGS

A more complete understanding of the present invention may be derived by referring to the detailed description and claims, considered in connection with the figures, wherein like reference numbers refer to similar elements throughout the figures, and:

DETAILED DESCRIPTION OF EXEMPLARY EMBODIMENTS

The present invention generally relates to microelectronic devices. More particularly, the invention relates to programmable structures suitable for various integrated circuit applications.

Figure 1:
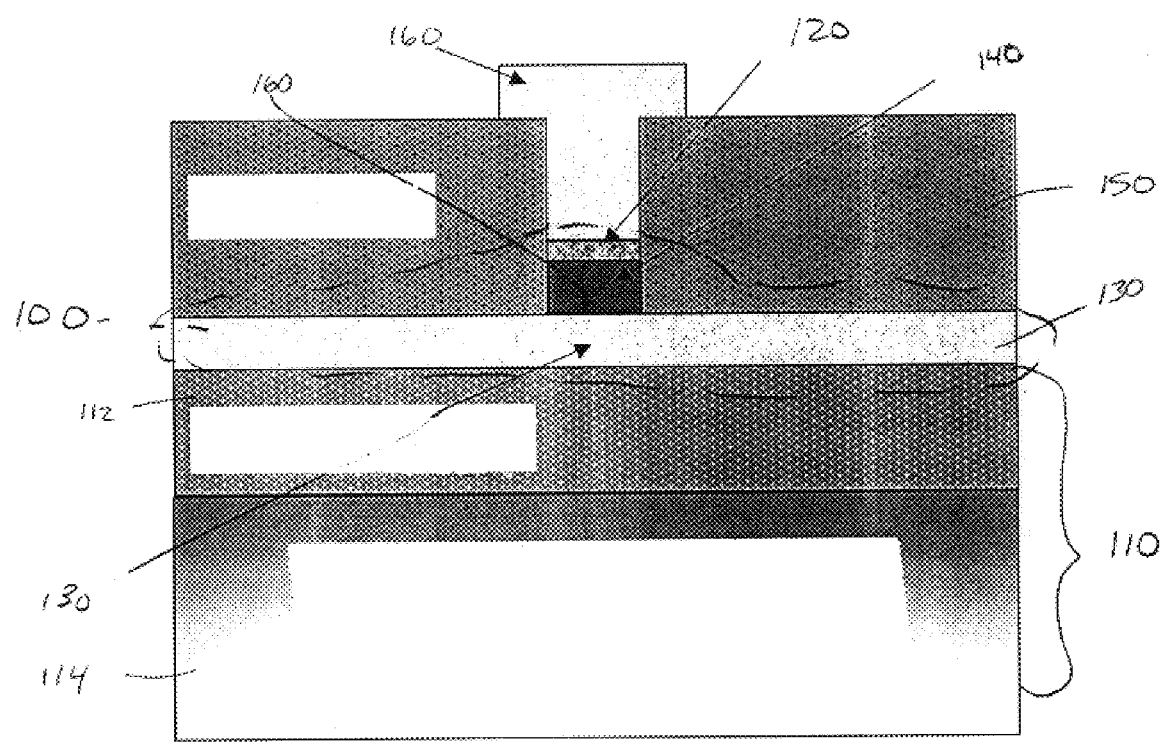
FIG. 1 is a cross-sectional illustration of a programmable structure formed on a surface of a substrate in accordance with the present invention.

FIG. 1 illustrates a programmable microelectronic structure 100 formed on a surface of a substrate 110 in accordance with an exemplary embodiment of the present invention. Structure 100 suitably includes electrodes 120 and 130 and an ion conductor 140.

Generally, structure 100 is configured such that when a bias greater than a threshold voltage ($V_T$), discussed in more detail below, is applied across electrodes 120 and 130, the electrical properties of structure 100 change. For example, in accordance with one embodiment of the invention, as a voltage $V \geq V_T$ is applied across electrodes 120 and 130, conductive ions within ion conductor 140 begin to migrate and form an electrodeposit (e.g., electrodeposit 160) at or near the more negative of electrodes 120 and 130. As the electrodeposit forms, the resistance between electrodes 120 and 130 decreases, and other electrical properties may also change. In the absence of any insulating barriers, which are discussed in more detail below, the threshold voltage required to grow the electrodeposit from one electrode toward the other and thereby significantly reduce the resistance of the device is essentially the redox potential of the system, typically a few hundred millivolts. If the same voltage is applied in reverse, the electrodeposit will dissolve back into the ion conductor and the device will return to its high resistance state. As discussed in more detail below, structure 100 may be used to store information and thus may be used in memory circuits. For example, structure 100 or other programmable structures in accordance with the present invention may suitably be used in memory devices to replace DRAM, SRAM, PROM, EPROM, or EEPROM devices.

Substrate 110 may include any suitable material. For example, substrate 110 may include semiconductive, conductive, semiinsulative, insulative material, or any combination of such materials. In accordance with one embodiment of the invention, substrate 110 includes an insulating material 112 and a portion 114 including microelectronic devices formed on a semiconductor substrate. Layers 112 and 114 may be separated by additional layers (not shown) such as, for example, layers typically used to form integrated circuits.

Electrodes 120 and 130 may be formed of any suitable conductive material. For example, electrodes 120 and 130 may be formed of polysilicon material or metal. In accordance with one exemplary embodiment of the invention, electrodes 120 and 130 are formed of metal, and at least one of electrodes 120, 130 is formed of a metal such as silver, copper, or zinc that dissolves in ion conductor material 140. Having at least one electrode formed of a metal which dissolves in ion conductor 140 facilitates maintaining a desired dissolved metal concentration within ion conductor 140, which in turn facilitates rapid and stable electrodeposit 160 formation within ion conductor 140 during use of structure 100.

In accordance with one embodiment of the invention, at least one electrode 120 and 130 is formed of material suitable for use as an interconnect metal. For example, electrode 130 may form part of an interconnect structure within a semiconductor integrated circuit. In accordance with one aspect of this embodiment, electrode 130 is formed of a material that is substantially insoluble in material comprising ion conductor 140. Exemplary materials suitable for both interconnect and electrode 130 material include metals and compounds such as tungsten, nickel, molybdenum, platinum, metal silicides, and the like.

Figure 2:
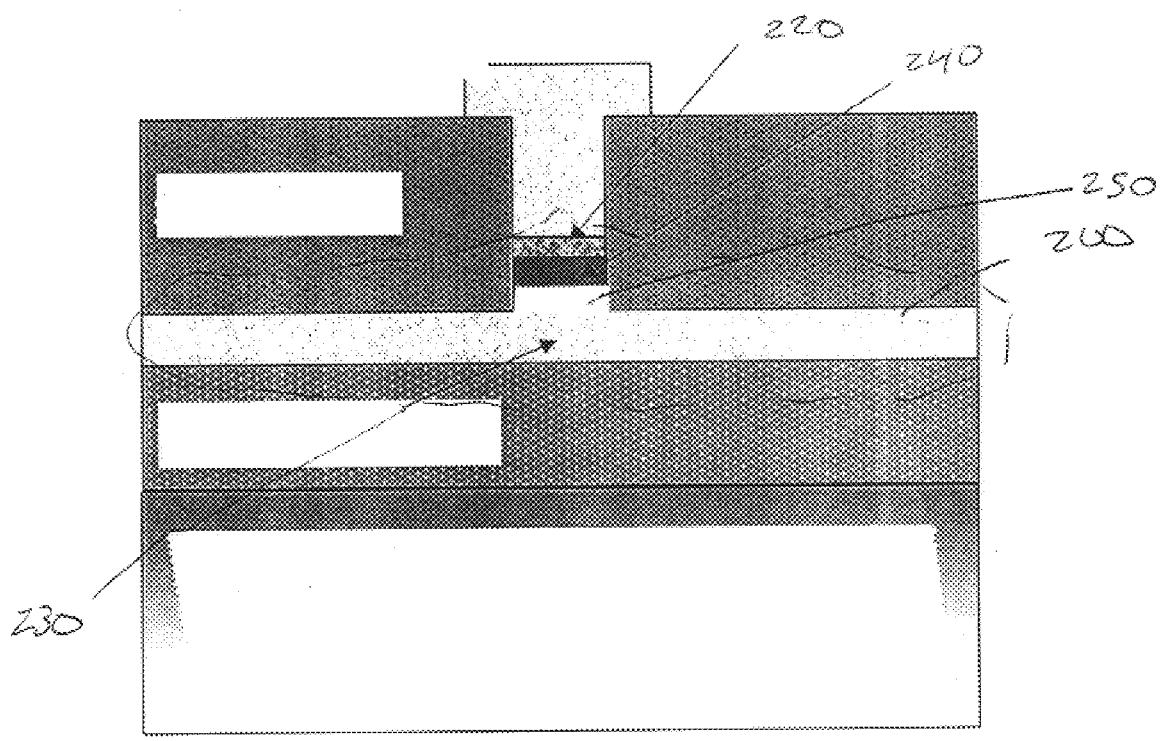
FIG. 2 is a cross-sectional illustration of a programmable structure in accordance with an alternative embodiment of the present invention.

Alternatively, as illustrated in FIG. 2, a structure 200, including electrodes 220 and 230, and ion conductor 240, may include a barrier layer (e.g., barrier 250), allowing one of electrodes 220, 230 to be formed of a material that dissolves in conductor 240. Barrier 250 may comprise any material that restricts migration of ions between conductor 240 and electrode 230. In accordance with exemplary embodiments of the invention, barrier 250 includes titanium nitride, titanium tungsten, a combination thereof, or the like. In accordance with one aspect of this embodiment, barrier 250 is electrically indifferent, i.e., it allows conduction of electrons through structure 200, but it does not itself contribute ions to conduction through structure 200. An electrically indifferent barrier may reduce undesired dendrite growth during operation of structure 200, and thus may facilitate an "erase" or dissolution of electrodeposit 160 when a bias is applied which is opposite to that used to grow the electrodeposit in the first instance.

Ion conductor 140 is formed of material that conducts ions upon application of a sufficient voltage. Suitable materials for ion conductor 140 include glasses and semiconductor materials. In one exemplary embodiment of the invention, ion conductor 140 is formed of chalcogenide material.

Ion conductor 140 may also suitably include dissolved conductive material. For example, ion conductor 140 may comprise a solid solution that includes dissolved metals and/or metal ions. In accordance with one exemplary embodiment of the invention, conductor 140 includes metal and/or metal ions dissolved in chalcogenide glass. An exemplary chalcogenide glass with dissolved metal in accordance with the present invention includes a solid solution of $As_xS_{1-x}$—Ag, $Ge_xSe_{1-x}$—Ag, $Ge_xS_{1-x}$—Ag, $As_xS_{1-x}$—Cu, $Ge_{x1-x}$—$Se_{1-x}$—Cu, $Ge_xS_{1-x}$—Cu, other chalcogenide materials including silver, copper, zinc, combinations of these materials, and the like. In addition, conductor 140 may include network modifiers that affect mobility of ions through conductor 140. For example, materials such as metals (e.g., silver), halogens, halides, or hydrogen may be added to conductor 140 to enhance ion mobility and thus increase erase/write speeds of the structure.

A solid solution suitable for use as ion conductor 140 may be formed in a variety of ways. For example, the solid solution may be formed by depositing a layer of conductive material such as metal over an ion conductive material such as chalcogenide glass and exposing the metal and glass to thermal and/or photo dissolution processing. In accordance with one exemplary embodiment of the invention, a solid solution of $As_2S_3$—Ag is formed by depositing $As_2S_3$ onto a substrate, depositing a thin film of Ag onto the $As_2S_3$, and exposing the films to light having energy greater than the optical gap of the $As_2S_3$,—e.g., light having a wavelength of less than about 500 nanometers. If desired, network modifiers may be added to conductor 140 during deposition of conductor 140 (e.g., the modifier is in the deposited material or present during conductor 140 material deposition) or after conductor 140 material is deposited (e.g., by exposing conductor 140 to an atmosphere including the network modifier).

In accordance with one aspect of this embodiment, a solid solution ion conductor 140 is formed by depositing sufficient metal onto an ion conductor material such that a portion of the metal can be dissolved within the ion conductor material and a portion of the metal remains on a surface of the ion conductor to form an electrode (e.g., electrode 120). In accordance with alternative embodiments of the invention, solid solutions containing dissolved metals may be directly deposited onto substrate 110.

An amount of conductive material such as metal dissolved in an ion conducting material such as chalcogenide may depend on several factors such as an amount of metal available for dissolution and an amount of energy applied during the dissolution process. However, when a sufficient amount of metal and energy are available for dissolution in chalcogenide material using photodissolution, the dissolution process is thought to be self limiting, substantially halting when the metal cations have been reduced to their lowest oxidation state. In the case of $As_2S_3$,—Ag, this occurs at $Ag_4As_2S_3=2Ag_2S+As_2S$, having a silver concentration of about 44 atomic percent. If, on the other hand, the metal is dissolved in the chalcogenide material using thermal dissolution, a higher atomic percentage of metal in the solid solution may be obtained, provided a sufficient amount of metal is available for dissolution.

In accordance with one exemplary embodiment of the invention, at least a portion of structure 100 is formed within a via of an insulating material 150. Forming a portion of structure 100 within a via of an insulating material 150 may be desirable because, among other reasons, such formation allows relatively small structures 100, e.g., on the order of 10 nanometers, to be formed. In addition, insulating material 150 facilitates isolating various structures 100 from other electrical components.

Insulating material 150 suitably includes material that prevents undesired diffusion of electrons and/or ions from structure 100. In accordance with one embodiment of the invention, material 150 includes silicon nitride, silicon oxynitride, polymeric materials such as polyimide or parylene, or any combination thereof A contact 160 may suitably be electrically coupled to one or more electrodes 120,130 to facilitate forming electrical contact to the respective electrode. Contact 160 may be formed of any conductive material and is preferably formed of a metal such as aluminum, aluminum alloys, tungsten, or copper.

A programmable structure in accordance with the present invention, e.g., structure 100, may be formed in a variety of ways. In accordance with one embodiment of the invention, structure 100 is formed by forming electrode 130 on substrate 110. Electrode 130 may be formed using any suitable method such as, for example, depositing a layer of electrode 130 material, patterning the electrode material, and etching the material to form electrode 130. Insulating layer 150 may be formed by depositing insulating material onto electrode 130 and substrate 110, and forming vias in the insulating material using appropriate patterning and etching processes. Ion conductor 140 and electrode 120 may then be formed within insulating layer 150 by depositing ion conductor 140 material and electrode 120 material within the via. Such ion conductor and electrode material deposition may be selective—i.e., the material is substantially deposited only within the via, or the deposition processes may be relatively non-selective. If one or more non-selective deposition methods are used, any excess material remaining on a surface of insulating layer 150 may be removed, using, for example, chemical mechanical polishing and/or etching techniques.

Figure 3:
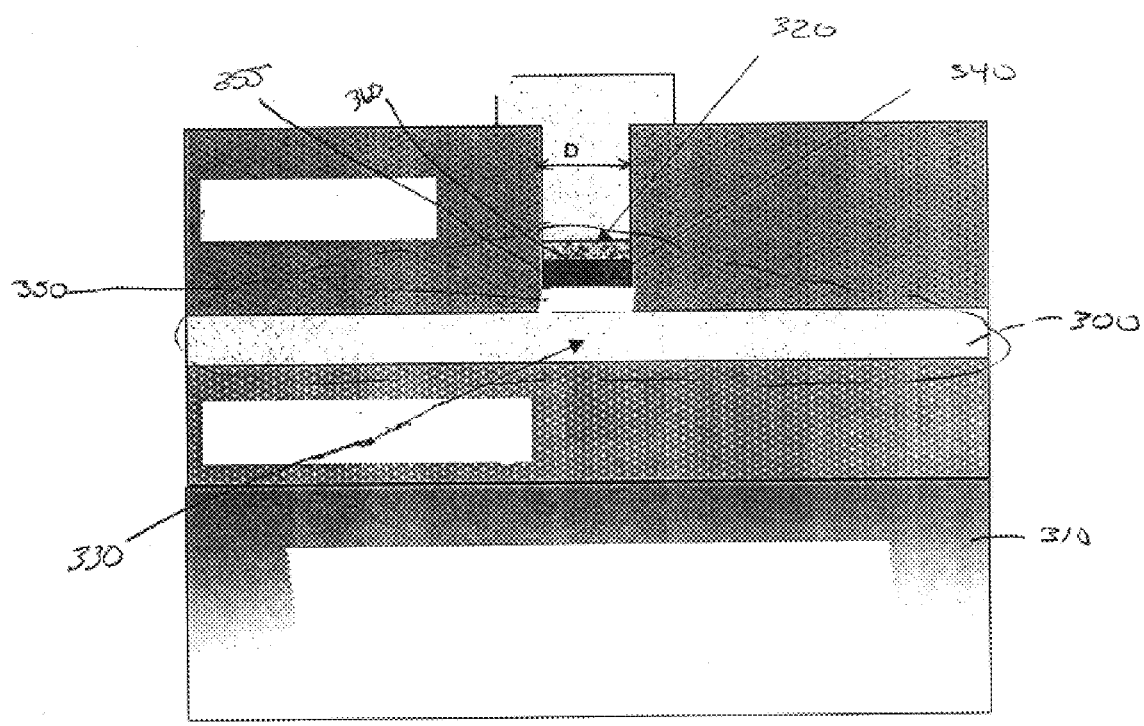
FIG. 3 is a cross-sectional illustration of a programmable structure in accordance with an alternative embodiment of the present invention.

FIG. 3 illustrates a programmable structure 300 in accordance with another embodiment of the present invention. Similar to structure 100, structure 300 is formed on a substrate 310 and includes electrodes 320 and 330, and an ion conductor 340. In addition, structure 300 includes an insulating barrier 350 interposed between at least one electrode 320, 330 and ion conductor 340. Insulating barrier 350 may be formed of any material resistant to conduction of electricity. In accordance with various exemplary embodiments of the invention, barrier 350 is formed of a metal oxide such as a native tungsten oxide or native nickel oxide. Alternatively other insulating materials may be deposited onto the electrode.

Among other things, barrier 350 may affect an effective threshold voltage of device 300 and prevent an electrical short between electrode 320 and 330 via an electrodeposit (e.g., electrodeposit 360) unless a voltage is applied which is sufficiently high to cause the insulating barrier to break down. For example, for a given insulating material, the effective threshold voltage of device 300 generally increases as a thickness of barrier 350 increase, thus device 300 threshold voltage may be controlled, at least in part, by controlling barrier 350 thickness. In this case, barrier 350 should be thin enough (i.e., 0 to about 3 nanometers) to allow electrons to tunnel through barrier 350 at a desired operating voltage (e.g., about 0.2V to about 4V).

In operation, when a sufficient voltage is applied between two or more electrodes of a programmable structure (e.g., electrodes 320 and 330 of structure 300), electrodeposit 360 begins to form, through or along an edge of ion conductor 340, from the more negative electrode (cathode) (e.g., electrode 330) toward the more positive electrode (anode) (e.g., electrode 320). For example, if electrode 330 is coupled to a negative terminal of a voltage supply and electrode 320 is coupled to a positive terminal of a voltage supply and a sufficient bias is applied between electrodes 320 and 330, electrodeposit 360—e.g., a metallic dendrite—will begin to grow from electrode 330 toward electrode 320.

When electrode 330 is initially coupled to a more negative potential, an electrodeposit begins to grow on surface 355 of barrier 350 upon application of a voltage ≧ the redox potential. As a voltage sufficient to breakdown barrier 350 is applied across electrodes 320 and 330 a short forms between electrodes 320 and 330. When a sufficient reverse bias is applied to electrodes 320 and 330, electrodeposit 360 dissolves in conductor 340 and barrier 350 appears to heal itself such that approximately the same effective threshold voltage is required to breakdown barrier 350. Thus, when structure 300 includes an insulating barrier 350, an effective threshold or "write" voltage is governed by breakdown characteristics (e.g., thickness) of barrier 350.

Growth and configuration of an electrodeposit (e.g., electrodeposit 360) and reversal of electrodeposit growth generally affect electrical properties of a programmable device such as structures 100–300. In turn, growth and a configuration of the electrodeposit depend on, among other things, an applied voltage bias, an amount of time the bias is applied to electrodes (e.g., electrodes) 320 and 330, and structure geometry. In particular, at relatively low voltages, electrodeposit growth is relatively slow and tends to concentrate about the cathode of a structure, whereas at higher voltages, the electrodeposit grows at a faster rate and tends to be more narrow and span a greater distance between the cathode and the anode, for a given amount of charge.

Once electrodeposit 360 begins to form, electrodeposit 360 will generally maintain its form after the voltage source is removed from structure 100. Thus, changes of electrical properties associated with growth of electrodeposit 360 (e.g., structure 300 capacitance, resistance, threshold voltage, and the like) do not vary substantially over time. In other words, the changes in electrical properties of structure 100 are relatively non-volatile. Accordingly, structure 100 may be well suited for memory devices of electronic systems that typically employ PROM, EPROM, EEPROM, FLASH devices, and the like.

In accordance with an alternate embodiment of the invention, the programmable structure may be periodically refreshed to enhance data storage integrity. In this case, the structure may be employed in a RAM (e.g., DRAM) memory device.

WRITE OPERATION

Information may be stored using programmable structures of the present invention by manipulating one or more electrical properties of the structures. For example, a resistance of a structure may be changed from a "0" or off state to a "1" or on state during a suitable write operation. Similarly, the device may be changed from a "1" state to a "0" state during an erase operation. In addition, as discussed in more detail below, the structure may have multiple programmable states such that multiple bits of information are stored in a single structure.

Figure 4:
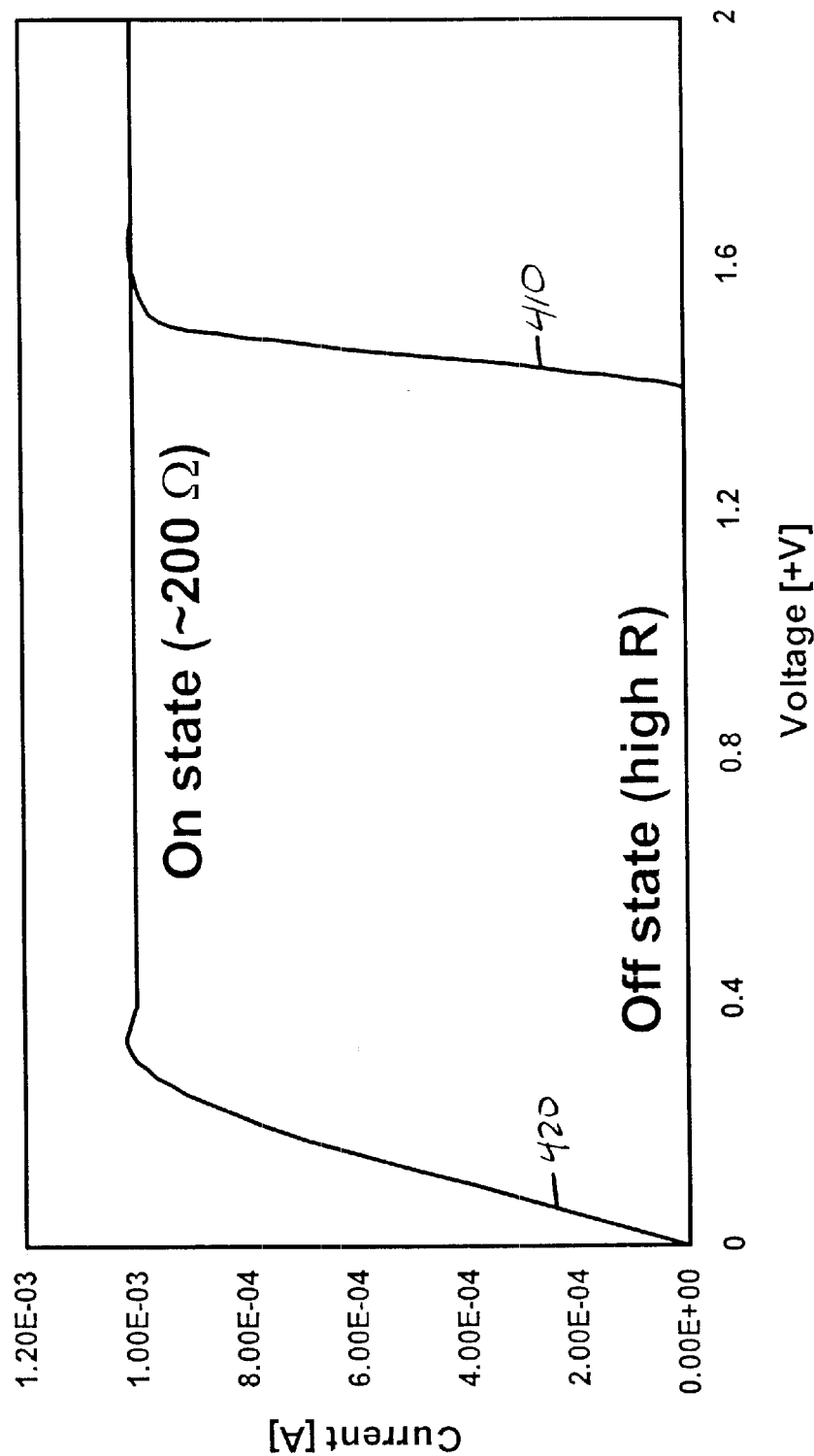
FIG. 4 is a current-voltage diagram illustrating current and voltage characteristics of the device illustrated in FIG. 3 in an "on" and "off" state.

FIG. 4 illustrates current-voltage characteristics of programmable structure 300 in accordance with the present invention. For the structure illustrated in FIG. 4, via diameter, D, is about 4 microns, conductor 340 is about 35 nanometers thick and formed of $Ge_3Se_7$—Ag (near $As_8Ge_3Se_7$), electrode 330 is indifferent and formed of nickel, electrode 320 is formed of silver, and barrier 350 is a native nickel oxide. As illustrated in FIG. 4, current through structure 300 in an off state (curve 410) begins to rise upon application of a bias of over about one volt; however, once a write step has been performed (i.e., an electrodeposit has formed), the resistance through conductor 340 drops significantly (i.e., to about 200 ohms), illustrated by curve 420 in FIG. 4. As noted above, when electrode 330 is coupled to a more negative end of a voltage supply, compared to electrode 320, electrodeposit 360 begins to form near electrode 330 and grow toward electrode 320. An effective threshold voltage (i.e., voltage required to cause growth of electrodeposit 360 and to break through barrier 350, thereby coupling electrodes 320,330 together) is relatively high because of barrier 350. In particular, a voltage $V \geq V_T$ must be applied to structure 300 sufficient to cause electrons to tunnel through barrier 350 to form the electrodeposit and to break down the barrier and conduct through conductor 340 and at least a portion of barrier 350.

In accordance with alternate embodiments of the invention illustrated in FIGS. 1 and 2, an initial "write" threshold voltage is relatively low because no insulative barrier is formed between, for example, ion conductor 140 and either of the electrodes 120, 130.

READ OPERATION

A state of the device (e.g., 1 or 0) may be read, without significantly disturbing the state, by, for example, applying a forward or reverse bias of magnitude less than a voltage threshold (about 1.4 V for a structure illustrated in FIG. 4)

for electrodeposition or by using a current limit which is less than or equal to the minimum programming current (the current which will produce the highest of the on resistance values). A current limited (to about 1 milliamp) read operation is shown in FIG. 4. In this case, the voltage is swept from 0 to about 2 V and the current rises up to the set limit (from 0 to 0.2 V), indicating a low resistance (ohmic/linear current-voltage) "on" state. Another way of performing a non-disturb read operation is to apply a pulse, with a relatively short duration, which may have a voltage higher than the electrochemical deposition threshold voltage such that no appreciable Faradaic current flows, i.e., nearly all the current goes to polarizing/charging the device and not into the electrodeposition process.

ERASE OPERATION

A programmable structure (e.g., structure 300) may suitably be erased by reversing a bias applied during a write operation, wherein a magnitude of the applied bias is equal to or greater than the threshold voltage for electrodeposition in the reverse direction. In accordance with an exemplary embodiment of the invention, a sufficient erase voltage ($V \geq V_T$) is applied to structure 300 for a period of time which depends on the strength of the initial connection but is typically less than about 1 millisecond to return structure 300 to its "off" state having a resistance well in excess of a million ohms. Because structure 300 does not include a barrier between conductor 340 and electrode 320, a threshold voltage for erasing structure 300 is much lower than a threshold voltage for writing structure 300 because, unlike the write operation, the erase operation does not require electron tunneling through barrier 350 or barrier 350 breakdown.

Figure 5:
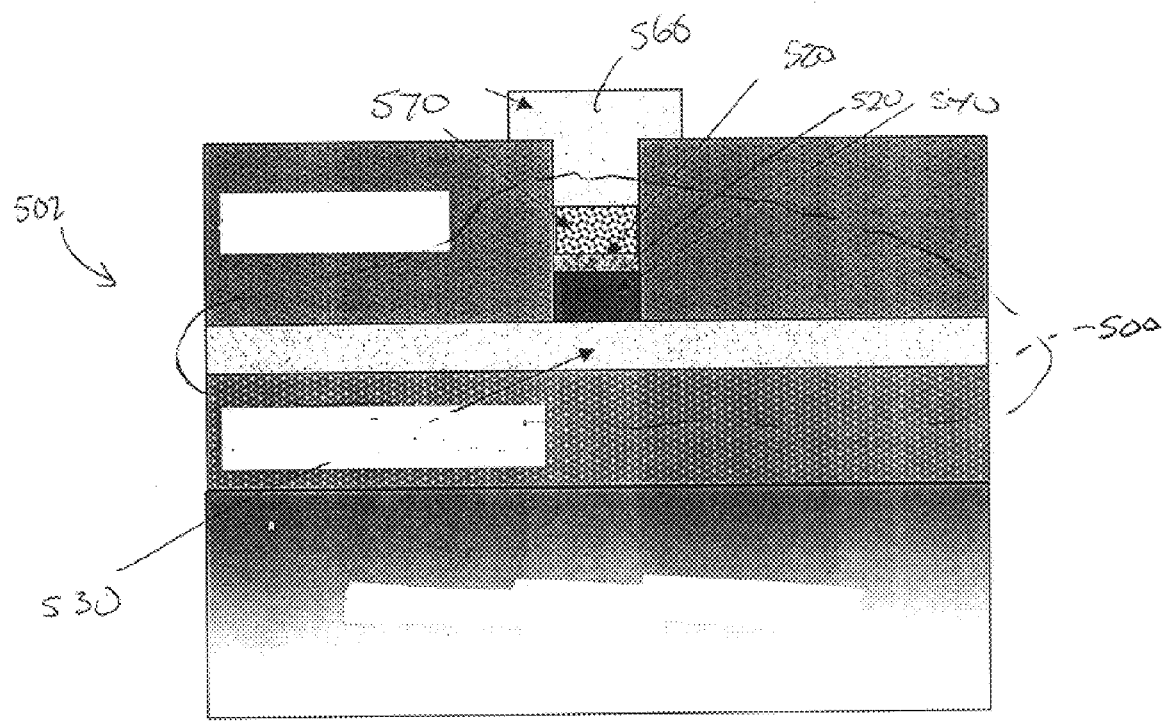
FIG. 5 is a cross-sectional illustration of a programmable structure in accordance with yet another embodiment of the present invention.

A portion of an integrated circuit 502, including a programmable structure 500, configured to provide additional isolation from electronic components is illustrated in FIG. 5. In accordance with an exemplary embodiment of the present invention, structure 500 includes electrodes 520 and 530, an ion conductor 540, a contact 560, and an amorphous silicon diode 570, such as a Schottky or p-n junction diode, formed between contact 560 and electrode 520. Rows and columns of programmable structures 500 may be fabricated into a high density configuration to provide extremely large storage densities suitable for memory circuits. In general, the maximum storage density of memory devices is limited by the size and complexity of the column and row decoder circuitry. However, a programmable structure storage stack can be suitably fabricated overlying an integrated circuit with the entire semiconductor chip area dedicated to row/column decode, sense amplifiers, and data management circuitry (not shown) since structure 500 need not use any substrate real estate. In this manner, storage densities of many gigabits per square centimeter can be attained using programmable structures of the present invention. Utilized in this manner, the programmable structure is essentially an additive technology that adds capability and functionality to existing semiconductor integrated circuit technology.

Figure 7:
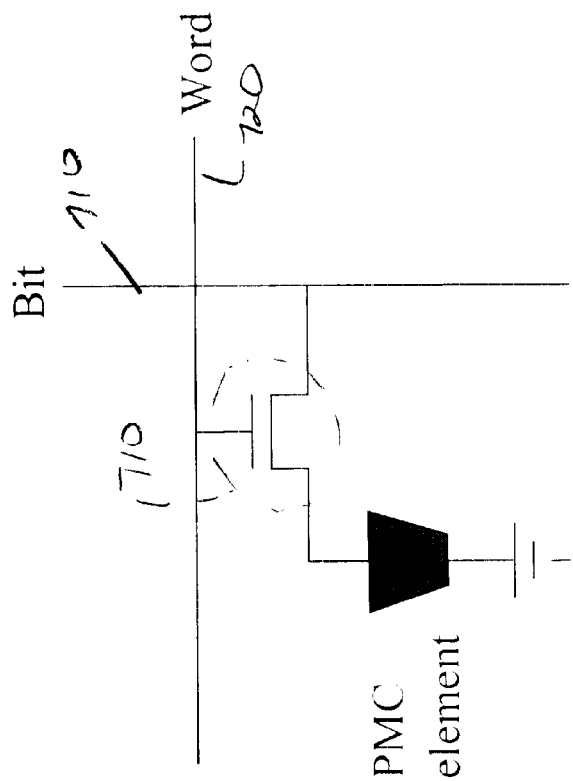
FIG. 7 is a schematic illustration of a portion of a memory device in accordance with an alternative embodiment of the present invention.
Figure 6:
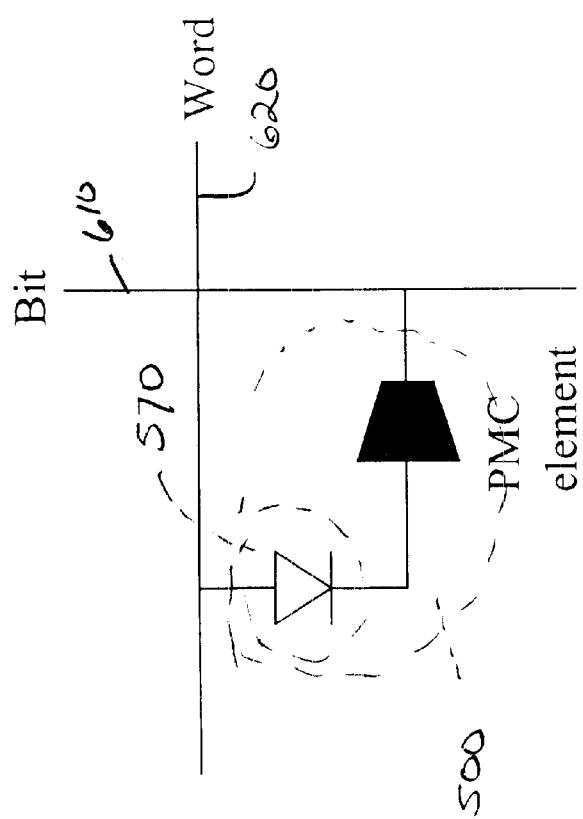
FIG. 6 is a schematic illustration of a portion of a memory device in accordance with an exemplary embodiment of the present invention.

FIG. 6 schematically illustrates a portion of a memory device including structure 500 having an isolating p-n junction 570 at an intersection of a bit line 610 and a word line 620 of a memory circuit. FIG. 7 illustrates an alternative isolation scheme employing a transistor 710 interposed between an electrode and a contact of a programmable structure located at an intersection of a bit line 710 and a word line 720 of a memory device.

As noted above, in accordance with yet another embodiment of the invention, multiple bits of data may be stored within a single programmable structure by controlling an amount of electrodeposit which is formed during a write process. An amount of electrodeposit that forms during a write process depends on a number of coulombs or charge supplied to the structure during the write process, and may be controlled by using a current limit power source. In this case, a resistance of a programmable structure is governed by Equation 1, where $R_{on}$ is the "on" state resistance, $V_T$ is the threshold voltage for electrodeposition, and $I_{LIM}$ is the maximum current allowed to flow during the write operation.

$$R_{on} = \frac{V_T}{I_{LIM}} \qquad \text{Equation 1}$$

In practice, the limitation to the amount of information stored in each cell will depend on how stable each of the resistance states is with time. For example, if a structure is with a programmed resistance range of about 3.5 kΩ and a resistance drift over a specified time for each state is about ±250 Ω, about 7 equally sized bands of resistance (7 states) could be formed, allowing 3 bits of data to be stored within a single structure. In the limit, for near zero drift in resistance in a specified time limit, information could be stored as a continuum of states, i.e., in analog form.

In accordance with yet another embodiment of the present invention, a programmable structure (e.g., structure 300) stores information by storing a charge as opposed to growing an electrodeposit. In accordance with one aspect of this embodiment, a capacitance of structure 300 is altered by applying a bias to electrodes 320, 330 (e.g. positive voltage to electrode 320 with respect to electrode 330) such that positively charged ions migrate toward electrode 330. If the applied bias is less that a write threshold voltage (or voltage required to break through barrier 350), no short will form between electrodes 320 and 330. Capacitance of the structure 300 changes as a result of the ion migration. When the applied bias is removed, the metal ions tend to diffuse away from barrier 350. However, an interface between conductor 340 and barrier 350 is generally imperfect and includes defects capable of trapping ions. Thus, at least a portion of ions remain at or proximate an interface between barrier 350 and conductor 340. If a write voltage is reversed, the ions may suitably be dispersed away from the interface. A more complete description of a programmable structure in accordance with this embodiment is provided in application Ser. No. 60/119,757, filed Feb. 11, 1999, the entire contents of which are incorporated herein by reference.

A programmable structure in accordance with the present invention may be used in many applications which would otherwise utilize traditional technologies such as EEPROM, FLASH or DRAM. Advantages provided by the present invention over present memory techniques include, among other things, lower production cost and the ability to use flexible fabrication techniques which are easily adaptable to a variety of applications. The programmable structures of the present invention are especially advantageous in applications where cost is the primary concern, such as smart cards and electronic inventory tags. Also, an ability to form the memory directly on a plastic card is a major advantage in these applications as this is generally not possible with other forms of semiconductor memories.

Further, in accordance with the programmable structures of the present invention, memory elements may be scaled to less than a few square microns in size, the active portion of the device being less than on micron. This provides a significant advantage over traditional semiconductor technologies in which each device and its associated interconnect can take up several tens of square microns.

Although the present invention is set forth herein in the context of the appended drawing figures, it should be appreciated that the invention is not limited to the specific form shown. For example, while the programmable structure is conveniently described above in connection with programmable memory devices, the invention is not so limited. For example, the structure of the present invention may suitably be employed as a programmable active or passive devices within a microelectronic circuit. Various other modifications, variations, and enhancements in the design and arrangement of the method and apparatus set forth herein, may be made without departing from the spirit and scope of the present invention as set forth in the appended claims.

I claim:

1. A microelectronic programmable structure comprising:
   an ion conductor formed of a solid solution containing a first conductive substance;
   a first electrode comprising a second conductive substance, wherein said first and said second conductive substances comprise the same material;
   a second electrode; and
   an insulating layer, wherein at least one of said first electrode and said second electrode is formed at least partially within the insulating layer.

2. The microelectronic programmable structure of claim 1, wherein said ion conductor is formed of a solid solution of a chalcogenide material and a metal.

3. The microelectronic programmable structure of claim 2, wherein said metal is selected from the group consisting of silver, copper, and zinc.

4. The microelectronic programmable structure of claim 2, wherein said chalcogenide material is selected from the group consisting of $As_xS_{1-x}$, $Ge_xS_{1-x}$, and $Ge_xSe_{1-x}$.

5. The microelectronic programmable structure of claim 1, wherein said first conductive substance is silver.

6. The microelectronic programmable structure of claim 1, wherein said first conductive substance is copper.

7. The microelectronic programmable structure of claim 1, further comprising a barrier interposed between at least one of said electrodes and said ion conductor.

8. The microelectronic programmable structure of claim 7, wherein said barrier comprises an insulating material.

9. The microelectronic programmable structure of claim 7, wherein said barrier comprises a conductive material.

10. The microelectronic programmable structure of claim 1, wherein at least a portion of the structure is formed within an insulating material via.

11. The microelectronic programmable structure of claim 1, further comprising a diode.

12. The microelectronic programmable structure of claim 1, further comprising a transistor.

13. The microelectronic programmable structure of claim 1, further comprising an electrodeposit.

14. The microelectronic programmable structure of claim 1, wherein said ion conductor includes a network modifier.

15. A microelectronic programmable structure comprising:
    a substrate;
    a first electrode formed overlying the substrate;
    an ion conductor material overlying the first electrode;
    a second electrode overlying the ion conductor; and
    a barrier layer interposed between the ion conductor and at least one of the first electrode and the second electrode.

16. The microelectronic programmable structure of claim 15, wherein the substrate includes a silicon substrate having a microelectronic device formed therein.

17. The microelectronic programmable structure of claim 15, wherein the barrier layer includes a conductive material.

18. The microelectronic programmable structure of claim 15, wherein the barrier layer includes an insulating material.

19. The microelectronic programmable structure of claim 15, wherein the barrier layer includes an electrically indifferent material.

20. The microelectronic programmable structure of claim 15, wherein one of the first electrode and the second electrode includes a material that dissolves within the ion conductor material during operation of the programmable structure.

* * * * *